(12) United States Patent
Pai et al.

(10) Patent No.: US 8,247,704 B2
(45) Date of Patent: Aug. 21, 2012

(54) MOTHERBOARD INTERCONNECTION DEVICE

(75) Inventors: Chia-Nan Pai, Taipei Hsien (TW); Han-Long Chen, Shenzhen (CN); Ning Li, Shenzhen (CN); Shou-Kuo Hsu, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 271 days.

(21) Appl. No.: 12/503,680

(22) Filed: Jul. 15, 2009

(65) Prior Publication Data

US 2010/0277882 A1 Nov. 4, 2010

(30) Foreign Application Priority Data

Apr. 29, 2009 (CN) .......................... 2009 1 0301984

(51) Int. Cl.
*H05K 1/18* (2006.01)
*H05K 3/30* (2006.01)

(52) U.S. Cl. ........ 174/262; 174/260; 174/261; 361/767; 361/780; 361/784; 257/737; 257/738

(58) Field of Classification Search .......... 174/254–267; 361/760–767, 805, 780–798; 257/E23.067, 257/684, 686, 690, 774, 735, E23.171, 737, 257/738; 710/300, 314; 216/13, 17, 18, 216/84; 29/825–852

See application file for complete search history.

(56) References Cited

U.S. PATENT DOCUMENTS

| | | | | |
|---|---|---|---|---|
| 4,636,919 A * | 1/1987 | Itakura et al. | ................. | 361/794 |
| 4,859,806 A * | 8/1989 | Smith | ............................ | 174/261 |
| 5,297,107 A * | 3/1994 | Metzger et al. | ................ | 361/778 |
| 5,417,577 A * | 5/1995 | Holliday et al. | ................ | 439/91 |
| 5,544,018 A * | 8/1996 | Sommerfeldt et al. | ........ | 361/792 |
| 6,417,462 B1* | 7/2002 | Dabral et al. | .................. | 174/261 |
| 6,434,016 B2 * | 8/2002 | Zeng et al. | ..................... | 361/760 |
| 6,486,405 B2 * | 11/2002 | Lin | ............................ | 174/113 R |
| 7,149,092 B2 * | 12/2006 | Iguchi | ........................... | 361/780 |
| 7,349,224 B2 * | 3/2008 | Ohsaka | ........................... | 361/767 |
| 7,448,909 B2 * | 11/2008 | Regnier et al. | ............ | 439/607.05 |
| 7,466,560 B2 * | 12/2008 | Hayashi et al. | ................ | 361/784 |
| 7,495,928 B2 * | 2/2009 | Ohsaka | ........................... | 361/767 |
| 7,594,105 B2 * | 9/2009 | Ohsaka | ........................... | 713/2 |
| 7,596,649 B2 * | 9/2009 | Hsu et al. | ....................... | 710/300 |
| 7,676,919 B2 * | 3/2010 | Zhao et al. | ...................... | 29/852 |
| 7,705,246 B1 * | 4/2010 | Pritchard et al. | .............. | 174/262 |
| 7,839,652 B2 * | 11/2010 | Ohsaka | ........................... | 361/767 |
| 7,968,802 B2 * | 6/2011 | Pai et al. | ......................... | 174/262 |
| 8,076,590 B2 * | 12/2011 | Zhao et al. | ...................... | 174/262 |
| 2002/0179332 A1* | 12/2002 | Uematsu et al. | .............. | 174/262 |

(Continued)

*Primary Examiner* — Michail V Datskovskiy
(74) *Attorney, Agent, or Firm* — Altis Law Group, Inc.

(57) ABSTRACT

A motherboard interconnection device includes a top layer, a bottom layer, a first and a third electronic elements positioned on the top layer, and a second and a fourth electronic elements positioned on the bottom layer. A first end of the first electronic element on the top layer is connected to the first end of the second electronic element on the bottom layer with a first via hole, and the first end of the third electronic element on the top layer is connected to the first end of the fourth electronic element on the bottom layer with a second via hole. The second ends of the two electronic elements on the top layer are connected to a first part, and the second ends of the two electronic elements on the bottom layer are connected to a second part.

5 Claims, 8 Drawing Sheets

U.S. PATENT DOCUMENTS

2004/0196062 A1* 10/2004 Fuller et al. .................. 326/30
2006/0091545 A1* 5/2006 Casher et al. ................ 257/738
2006/0266549 A1* 11/2006 Lin et al. .................... 174/262
2007/0152771 A1* 7/2007 Shan et al. ................... 333/33
2008/0151513 A1* 6/2008 Parchesky .................... 361/760
2010/0012363 A1* 1/2010 Chen et al. ................... 174/260

* cited by examiner

FIG. 1

(Prior art)

MOTHERBOARD INTERCONNECTION DEVICE

BACKGROUND

1. Technical Field

Embodiments of the present disclosure relate to motherboard design methods, and particularly to a motherboard and motherboard layout method.

2. Description of Related Art

Figure 1:
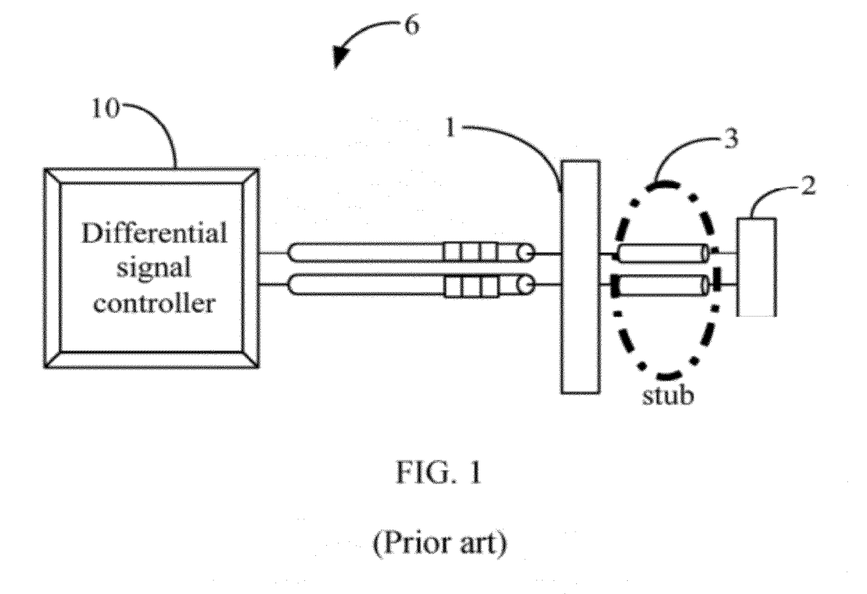
FIG. 1 is a schematic diagram of one embodiment of a motherboard layout method in a prior art.

Motherboard layout is an important phase in the manufacturing process of a motherboard and is closely related to product quality. If two different kinds of parts are installed on the motherboard, a co-lay method is used to connect the different parts (refer to FIG. 1). Co-lay is a process where one part 1 is electronically connected to the motherboard through another part 2. However, as shown in FIG. 1, if only the part 1 is used, then the connection to the other part 2 becomes a stub, and the stub can interfere with a differential signal transmitted by the part 1.

DETAILED DESCRIPTION

Figure 2:
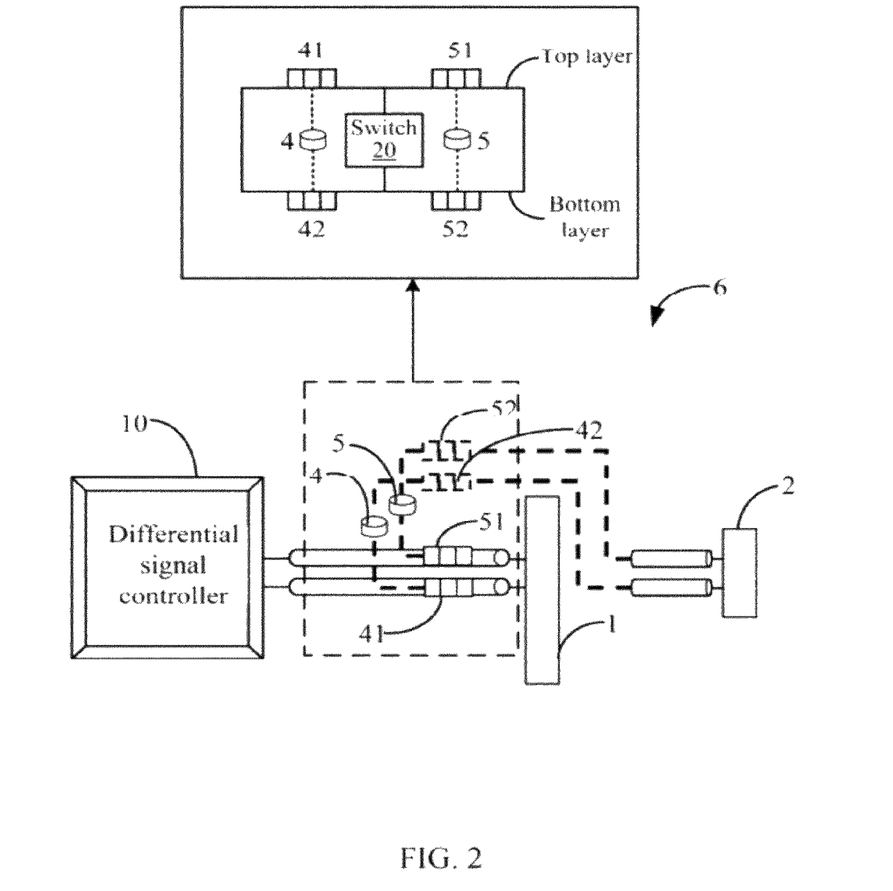
FIG. 2 is a plane view of one embodiment of a motherboard layout method provided in the present application.

FIG. 2 is a plane view of one embodiment of a motherboard 6 in communication with electronic elements. One embodiment of a layout method for the motherboard 6 is described with reference to FIG. 3A and FIG. 3B, firstly, two electronic elements, such as a capacitor 41 and a capacitor 51, are positioned on a top layer of the motherboard 6, and another two electronic elements, such as a capacitor 42 and a capacitor 52, are positioned on a bottom layer of the motherboard 6. In one embodiment, a switch 20 is used in the motherboard 6 and is connected to the top layer of the motherboard 6 if a first part 1 is used, or connected to the bottom layer of the motherboard 6 if a second part 2 is used. The switch may be hardware or software. In other embodiments, the electronic elements may be resistors.

Figure 3A:
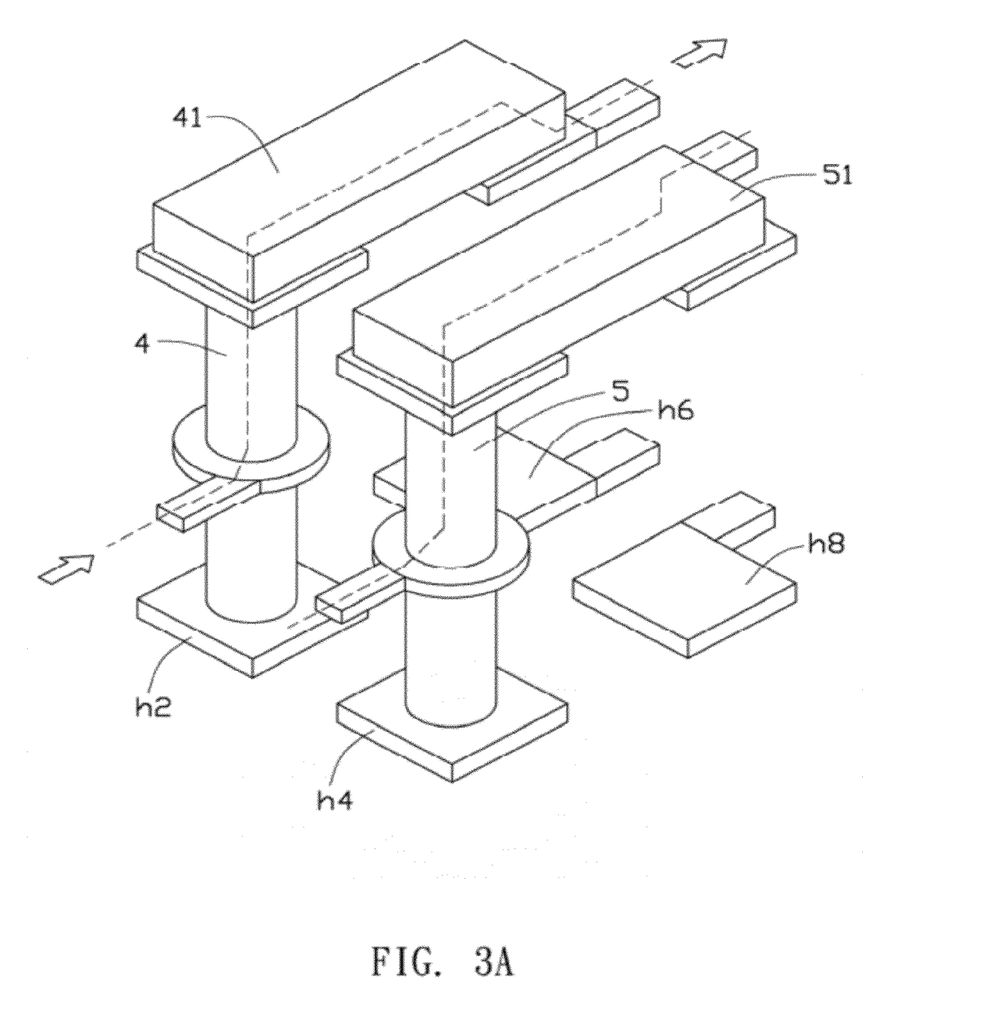
FIG. 3A is a schematic view of one embodiment of a layout of a first part in FIG. 2.
Figure 3B:
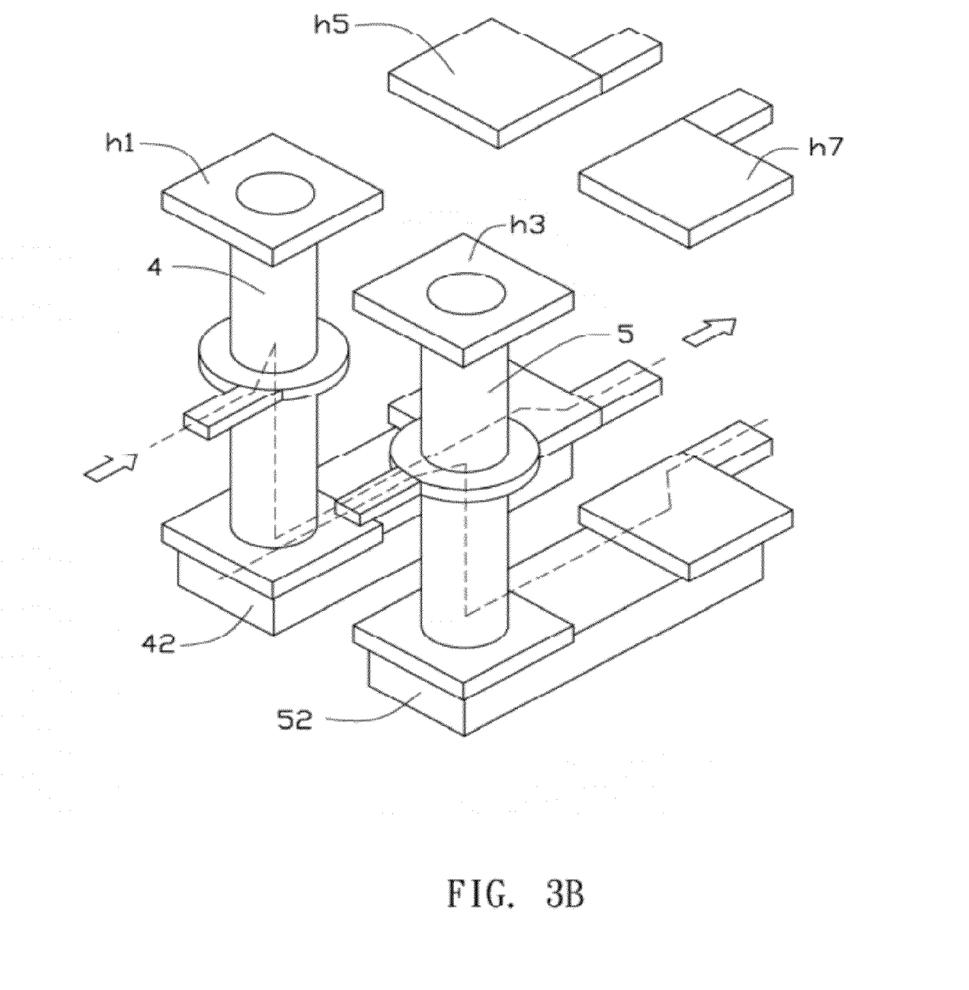
FIG. 3B is a schematic view of one embodiment of a layout of a second part in FIG. 2.

Secondly, a first via hole 4 is connected to a first bonding pad h1 of one end of the capacitor 41 of the top layer, and a second bonding pad h2 of the same end of the capacitor 42 on the bottom layer corresponding to the capacitor 41.

Thirdly, a second via hole 5 is connected to a third bonding pad h3 of the same end of the capacitor 51 of the top layer, and a fourth bonding pad h4 of the same end of the capacitor 52 on the bottom layer corresponding to the capacitor 51.

Fourthly, the first part 1 is connected to a bonding pad h5 of the capacitor 41 and a bonding pad h7 of the capacitor 51 on the top layer of the motherboard 6, and the second part 2 is connected to a bonding pad h6 of the capacitor 42 and a bonding pad h8 of the capacitor 52 on the bottom layer of the motherboard 6. In one embodiment, a type of the first part 1 is different from a type of the second part 2.

If only the first part 1 is used, the two electronic elements on the top layer (e.g., the capacitor 41 and the capacitor 51) of the motherboard 6 are connected to the first part 1, and differential signals sent by a differential signal controller 10 are transmitted to the first part 1 through the two electronic elements on the top layer of the motherboard 6 (refer to a broken line shown in FIG. 3A). In one embodiment, the differential signal controller 10 is positioned on a north bridge or a south bridge of the motherboard 6.

If only the second part 2 is used, the two electronic elements on the bottom layer (e.g., the capacitor 42 and the capacitor 52) of the motherboard 6 are connected to the second part 2, and differential signals sent by the differential signal controller 10 are transmitted to the second part 2 through the two electronic elements on the bottom layer of the motherboard 6 (refer to a broken line shown in FIG. 3B).

In other embodiments, the first part 1 may be connected to the bonding pad h6 of the capacitor 42 and the bonding pad h8 of the capacitor 52 on the bottom layer of the motherboard 6, and the second part 2 may be connected to the bonding pad h5 of the capacitor 41 and the bonding pad h7 of the capacitor 51 on the top layer of the motherboard 6.

Figure 4A:
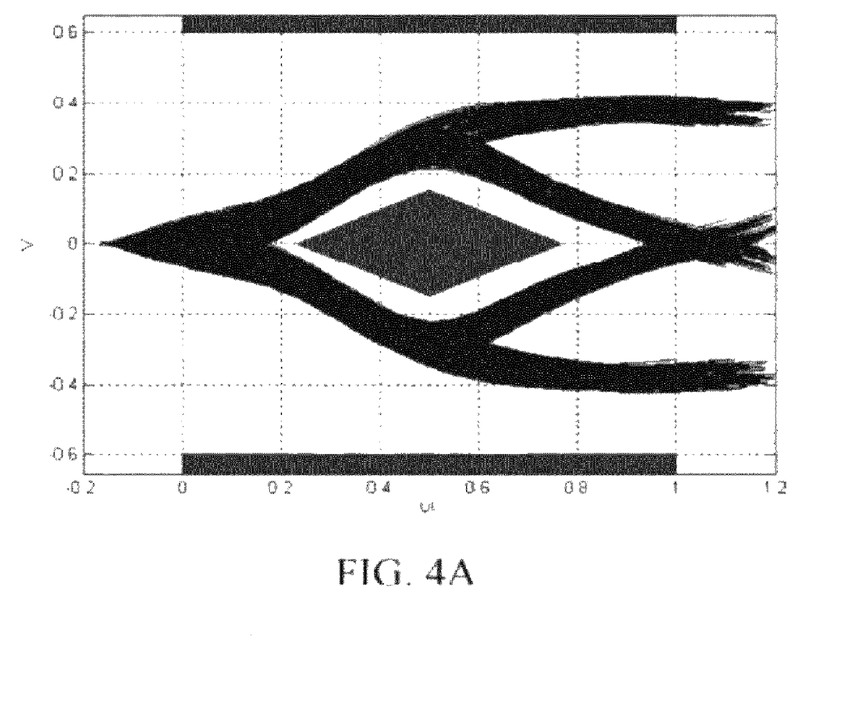
FIG. 4A is a schematic diagram of one embodiment of a simulation result of a differential signal transmitted by the first part of FIG. 1.
Figure 5A:
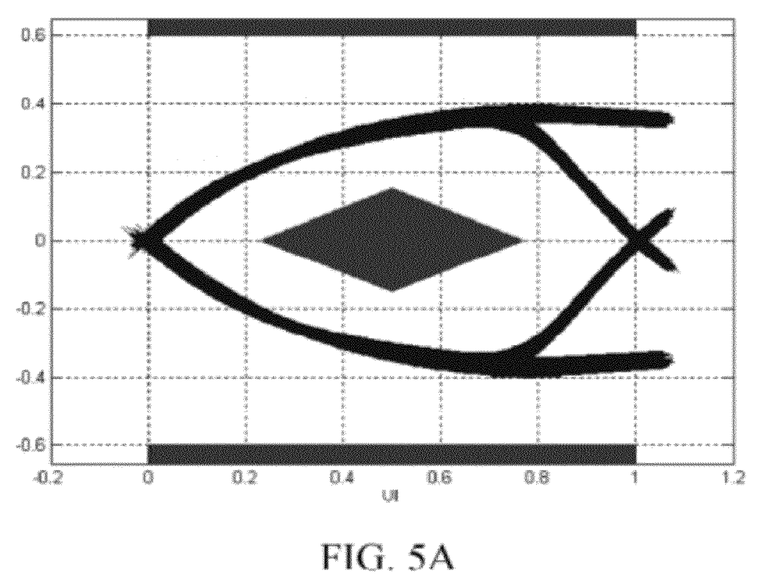
FIG. 5A is a schematic diagram of one embodiment of a simulation result of a differential signal transmitted by the first part of FIG. 2.

FIG. 4A is a schematic diagram of one embodiment of a simulation result of a differential signal transmitted by the first part 1 of FIG. 1, and FIG. 5A is a schematic diagram of one embodiment of a simulation result of a differential signal transmitted by the first part 1 of FIG. 2. In one exemplary example, a length of the stub in FIG. 4A is 800 mil, and the stub in FIG. 5A is substantially removed. Thus, quality of the differential signal transmitted by the first part 1 of FIG. 2 is better than quality of the differential signal transmitted by the first part 1 of FIG. 1.

Figure 4B:
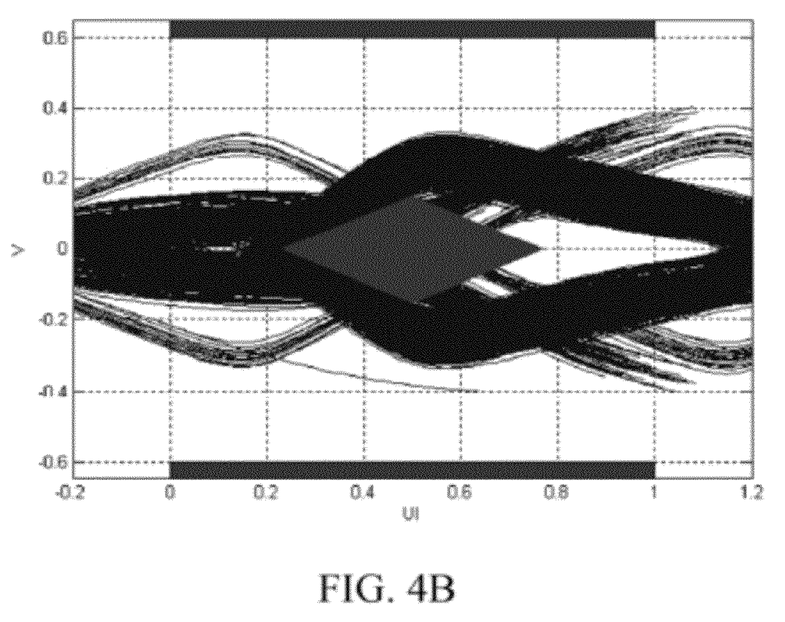
FIG. 4B is a schematic diagram of one embodiment of a simulation result of a differential signal transmitted by second part of FIG. 1.
Figure 5B:
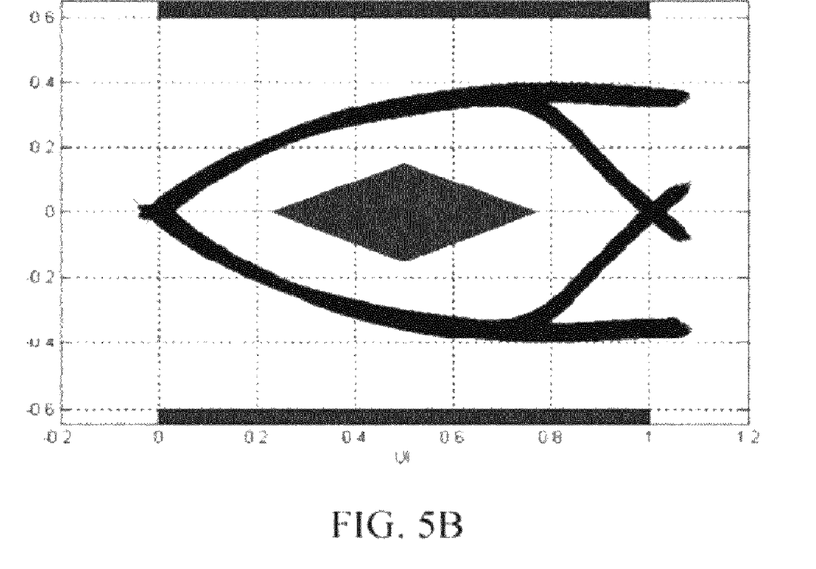
FIG. 5B is a schematic diagram of one embodiment of a simulation result of a differential signal transmitted by the second part of FIG. 2.

FIG. 4B is a schematic diagram of one embodiment of a simulation result of a differential signal transmitted by the second part 2 of FIG. 1, and FIG. 5B is a schematic diagram of one embodiment of a simulation result of a differential signal transmitted by the second part 2 of FIG. 2. In one exemplary example, a length of the stub in FIG. 4B is 1600 mil, and the stub in FIG. 5B is substantially removed. Thus, quality of the differential signal transmitted by the second part 2 of FIG. 2 is better than quality of the differential signal transmitted by the second part 2 of FIG. 1.

The present embodiment connects the first part 1 and the second part 2 of the motherboard 6 with the via hole 4 and the via hole 5, so as to improve quality of the differential signal transmitted by the first part 1 or the second part 2.

It should be emphasized that the above-described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A motherboard interconnection device, comprising:
a first and a third electronic element being positioned on a top layer of the motherboard interconnection device and a second and a fourth electronic element being positioned on a bottom layer of the motherboard interconnection device;
a first via hole that connects a first bonding pad of a first end of the first electronic element on the top layer to a second bonding pad of the first end of the second electronic element on the bottom layer corresponding to the first electronic element on the top layer;
a second via hole that connects a third bonding pad of the first end of the third electronic element on the top layer to a fourth bonding pad of the first end of the fourth electronic element on the bottom layer corresponding to the third electronic element on the top layer;
a first part that connects to a bonding pad of a second end of the first and the third electronic elements on the top layer; and
a second part that connects to a bonding pad of the second end of the second and the fourth electronic elements on the bottom layer.

2. The motherboard interconnection device according to claim 1, wherein the first, second, third, and fourth electronic elements are selected from the group consisting of a capacitor and a resistor.

3. The motherboard interconnection device according to claim 1, wherein a type of the first part is different from a type of the second part.

4. The motherboard interconnection device according to claim 3, wherein the first and the third electronic elements on the top layer are connected to the first part, and differential signals are transmitted to the first part through the first and the third electronic elements on the top layer of the motherboard interconnection device.

5. The motherboard interconnection device according to claim 3, wherein the second and the fourth electronic elements on the bottom layer are connected to the second part, and differential signals are transmitted to the second part through the second and the fourth electronic elements on the bottom layer of the motherboard interconnection device.

* * * * *